US012680191B2

(12) United States Patent
    Okabe

(10) Patent No.: US 12,680,191 B2
(45) Date of Patent: Jul. 14, 2026

(54) VAPOR PHASE GROWTH SYSTEM AND METHOD OF PRODUCING EPITAXIAL WAFER

(71) Applicant: Epicrew Corporation, Ohmura (JP)

(72) Inventor: Akira Okabe, Ohmura (JP)

(73) Assignee: Epicrew Corporation, Ohmura (JP)

( * ) Notice: Subject to any disclaimer, the term of this patent is extended or adjusted under 35 U.S.C. 154(b) by 601 days.

(21) Appl. No.: 18/299,020

(22) Filed: Apr. 11, 2023

(65) Prior Publication Data

US 2023/0265580 A1 Aug. 24, 2023

Related U.S. Application Data

(63) Continuation of application No. PCT/JP2021/024794, filed on Jun. 30, 2021.

(30) Foreign Application Priority Data

Oct. 12, 2020 (JP) ................................. 2020-172195

(51) Int. Cl.
    *C30B 25/10* (2006.01)
    *C23C 16/455* (2006.01)
    (Continued)

(52) U.S. Cl.
    CPC ........ *C30B 25/10* (2013.01); *C23C 16/45508* (2013.01); *C23C 16/4584* (2013.01);
    (Continued)

(58) Field of Classification Search
    CPC .......... C23C 16/45508; C23C 16/4584; C23C 16/4585; C23C 16/46; C30B 25/10;
    (Continued)

(56) References Cited

U.S. PATENT DOCUMENTS

| 10,975,495 | B2 | 4/2021 | Komori | |
| 2003/0173031 | A1* | 9/2003 | Aggarwal | ............. C23C 16/481 |
| | | | | 118/728 |

(Continued)

FOREIGN PATENT DOCUMENTS

| JP | 2005-183510 A | 7/2005 |
| JP | 2011-165948 A | 8/2011 |

(Continued)

OTHER PUBLICATIONS

International Search Report dated Sep. 7, 2021, of corresponding International Application No. PCT/JP2021/024794 along with an English translation.

(Continued)

*Primary Examiner* — Matthew J Song
(74) *Attorney, Agent, or Firm* — DLA Piper LLP (US)

(57) ABSTRACT

In a vapor phase growth system in which a preheating ring is provided around a susceptor, the flow rate of source gas can be adjusted by changing the position of the susceptor, and the effect on the film thickness variation of a semiconductor single-crystal layer due to the changes of the position of the susceptor is caused to be less likely to occur. The susceptor is raised/lowered by a susceptor position changing mechanism, and the height position of holding the susceptor in a reaction vessel body can be changed. A preheating ring position changing mechanism changes the height position of holding the preheating ring in the reaction vessel body based on raising/lowering of the preheating ring in accordance with the changes of the height position of holding the susceptor. The misalignment between the preheating ring and the substrate in the height direction may be reduced even if the susceptor holding position is changed, advantageously reducing the effects of insufficient heat equalization effect on the outer circumference of the substrate due to the preheating ring and the effect of turbulence in the source gas flow (Continued)

due to a step between the substrate main surface and the preheating ring, and thereby reducing the effects on the thickness variation of the resulting semiconductor single-crystal layer.

9 Claims, 10 Drawing Sheets

(51) Int. Cl.

| | |
|---|---|
| *C23C 16/458* | (2006.01) |
| *C23C 16/46* | (2006.01) |
| *C30B 25/12* | (2006.01) |
| *C30B 25/14* | (2006.01) |
| *H10P 14/20* | (2026.01) |
| *H10P 72/76* | (2026.01) |

(52) U.S. Cl.
CPC .............. *C23C 16/46* (2013.01); *C30B 25/12* (2013.01); *C30B 25/14* (2013.01); *H10P 14/20* (2026.01); *H10P 14/2905* (2026.01); *H10P 14/3411* (2026.01); *H10P 72/7618* (2026.01)

(58) Field of Classification Search
CPC ... C30B 25/12; C30B 25/14; H01L 21/02381; H01L 21/02532; H01L 21/02634; H01L 21/67103; H01L 21/68735; H01L 21/68742; H01L 21/68764
See application file for complete search history.

(56) References Cited

U.S. PATENT DOCUMENTS

| | | | |
|---|---|---|---|
| 2007/0107653 | A1 | 5/2007 | Yamada |
| 2014/0116340 | A1 | 5/2014 | Mori et al. |
| 2016/0186360 | A1 | 6/2016 | Hirose et al. |
| 2018/0282865 | A1* | 10/2018 | Wang ..................... C30B 25/10 |

FOREIGN PATENT DOCUMENTS

| | | |
|---|---|---|
| JP | 2016-122779 A | 7/2016 |
| JP | 6068255 B2 | 1/2017 |
| JP | 2018-148098 A | 9/2018 |
| TW | 2019-29050 | 7/2019 |
| WO | 2014/065428 | 5/2014 |

OTHER PUBLICATIONS

Matsui, M. et al., "Numerical Calculation of Silicon Epitaxial Growth Rate for 450 mmo Substrate," 2014, *Proceedings of the 75th Fall Meeting of the Japan Society of Applied Physics*, p. 19a-A19-1, along with an English translation.

Habuka, H., "Numerical Simulation of Silicon Epitaxial Film Growth," 2006, vol. 49, No. 9, *Journal of the Vacuum Society of Japan*, pp. 525-529, along with an English translation.

Extended European Search Report dated on Sep. 27, 2024, for counterpart European Patent Application No. 21 879 697.7.

Office Action dated on May 29, 2024, for counterpart Taiwanese Patent Application No. 110131456 with English Translation.

Office Action dated Feb. 15, 2025, from corresponding Korean Patent Application No. 10-2023-7005572.

* cited by examiner

| SUSCEPTOR HEIGHT | PREHEATING RING HEIGHT | SUBSTRATE TEMPERATURE | FLOW RATE (INSIDE) | FLOW RATE (OUTSIDE) |
|---|---|---|---|---|
| P1 | P1' | T1 | F11 | F21 |
| P2 | P2' | T2 | F12 | F22 |
| P3 | P3' | T3 | F13 | F23 |
| P4 | P4' | T4 | F14 | F24 |
| P5 | P5' | T5 | F15 | F25 |
| . | . | . | . | . |
| . | . | . | . | . |

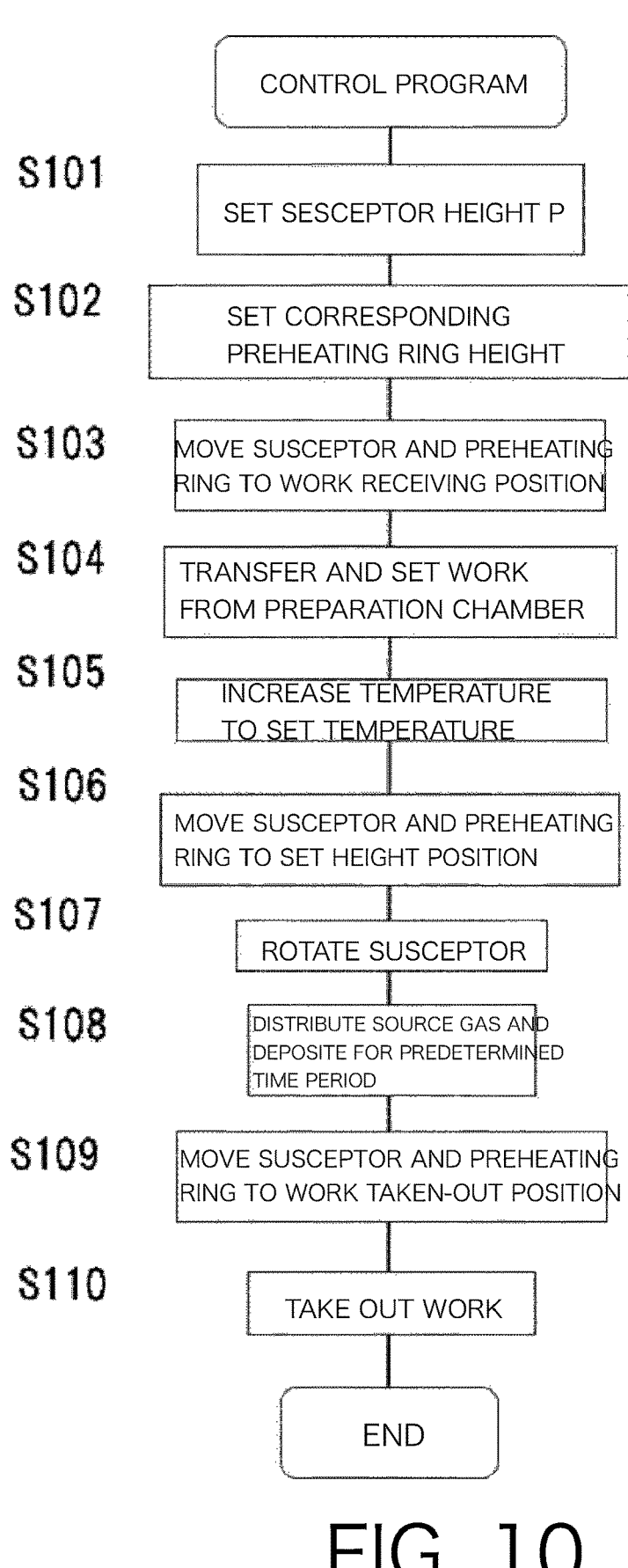

S101

S102

S103

S104

S105

S106

S107

S108

S109

S110

CONTROL PROGRAM

SET SESCEPTOR HEIGHT P

SET CORRESPONDING
PREHEATING RING HEIGHT

MOVE SUSCEPTOR AND PREHEATING
RING TO WORK RECEIVING POSITION

TRANSFER AND SET WORK
FROM PREPARATION CHAMBER

INCREASE TEMPERATURE
TO SET TEMPERATURE

MOVE SUSCEPTOR AND PREHEATING
RING TO SET HEIGHT POSITION

ROTATE SUSCEPTOR

DISTRIBUTE SOURCE GAS AND
DEPOSITE FOR PREDETERMINED
TIME PERIOD

MOVE SUSCEPTOR AND PREHEATING
RING TO WORK TAKEN-OUT POSITION

TAKE OUT WORK

END

FIG. 10

VAPOR PHASE GROWTH SYSTEM AND METHOD OF PRODUCING EPITAXIAL WAFER

TECHNICAL FIELD

This disclosure relates to a vapor phase growth system for growing a vapor phase of a semiconductor single-crystal thin film on a main surface of a single-crystal substrate and a method of manufacturing an epitaxial wafer embodied using the system.

BACKGROUND

An epitaxial wafer obtained by forming a semiconductor single-crystal thin film on a single-crystal substrate, for example, a silicon epitaxial wafer obtained by forming a silicon single-crystal thin film (a "thin film") on the surface of a silicon single-crystal substrate (a "substrate") by a vapor phase growth method have been widely used in electronic devices such as bipolar ICs and MOS-ICs. For example, a single-wafer vapor phase growth system has become the mainstream in the production of an epitaxial wafer with a diameter of 200 mm or greater in place of batch processing of multiple wafers in recent years. In that method, a substrate is rotationally and horizontally held in a reaction vessel, and a thin film is formed by growing a vapor phase by supplying source gas from one end to the other of the reaction vessel in a substantially horizontal and unidirectional manner. In general, infrared radiation heating, high-frequency induction heating, or resistance heating is used to heat the substrate during the production of silicon epitaxial wafers, creating a cold wall environment in which the temperature of the walls of the reaction vessel is kept low, and the temperature of the silicon substrate and susceptor is increased.

In a single-wafer vapor phase growth system, source gas is usually supplied through a gas inlet port formed at one end of the reaction vessel via a gas supply pipe, and after flowing along the main surface of the substrate, the source gas is discharged through an outlet port at the other end of the vessel. When manufacturing epitaxial wafers using the system with that structure, it is known that increasing the flow rate of the source gas along the main surface of the substrate is effective in increasing the growth rate of the silicon single-crystal thin films. For example, "Numerical Calculation of 450 mmφ Silicon Epitaxial Growth Rate": Proceedings of the 75th Fall Meeting of the Japan Society of Applied Physics (Fall 2014, Hokkaido University) 19a-A19-1 discloses that when a silicon epitaxial wafer is produced, the growth rate of a silicon single-crystal layer deposited on the substrate can be increased by increasing the relative velocity between the main surface of the substrate and the source gas by increasing the rotation speed of the susceptor.

In the experiment disclosed in "Numerical Calculation of 450 mmφ Silicon Epitaxial Growth Rate": Proceedings of the 75th Fall Meeting of the Japan Society of Applied Physics (Fall 2014, Hokkaido University) 19a-A19-1, the concentration and flow rate of the source gas supplied to the reaction vessel were set constant, and the results showed that the growth rate of the silicon single-crystal layer increased when the rotation speed of the susceptor was increased under the conditions. "Simulation of Si Epitaxial Thin Film Formation Process": Journal of the Vacuum Society of Japan, Vol. 49 (2006), pp. 525-529 also shows thermodynamically that in the above cold wall environment, as the gas phase temperature increases during the growth of a silicon single-crystal layer, the growth rate of the single-crystal layer decreases in the region where the transport rate of the source gas components is rate-limiting (i.e., the diffusion layer on the main surface of the substrate).

That is, the greater the gas flow rate on the main surface of the substrate is increased, the more the heat transfer from the main surface of the substrate is accelerated, reducing the temperature of the main surface of the substrate as well as the thickness of the diffusion layer on the main surface of the substrate due to the increase of the gas flow rate, and increasing the concentration gradient of the source gas components in the diffusion layer. These factors are believed to increase the efficiency of the chemical reaction that produces silicon single-crystals from the source gas and increase the growth rate of the silicon single-crystal layers.

It is believed effective to employ a configuration with a reduced space height between the main surface of the substrate as the source gas distribution channel and the lower surface of the ceiling plate of the reaction vessel to increase the flow rate of the source gas on the main surface of the substrate and the growth rate of a semiconductor single-crystal layer in a single wafer vapor phase growth system. Specifically, the above space height can be reduced by employing a configuration in which the susceptor holding the substrate is positioned closer to the lower surface of the ceiling plate of the reaction vessel in the height direction during the semiconductor single-crystal growth process.

In contrast, as the growth rate of the semiconductor single-crystal layer increases, the thickness distribution width in the plane of the formed semiconductor single-crystal layer tends to increase. For example, if the demand for flatness of the main surface of the epitaxial wafer where elements are fabricated is particularly stringent due to the die shrink of electronic devices, it may be advantageous to keep the growth rate of the semiconductor single-crystal layer low. Thus, it is believed effective to reduce the flow rate of the source gas by employing a configuration in which the susceptor is positioned away from the lower surface of the ceiling plate of the reaction vessel, i.e., a configuration in which the space height between the substrate main surface, which serves as the source gas distribution channel, and the lower surface of the ceiling plate of the reaction vessel is increased.

For example, Japanese Registered Patent No. 6068255 discloses a vapor phase growth system that incorporates a mechanism to raise and lower a susceptor (and a susceptor cover) in a reaction vessel. However, the purpose of raising and lowering the susceptor in JP 6068255 is to improve workability during system maintenance, and JP 6068255 fails to disclose the technical concept of adjusting the flow rate of the source gas by changing the susceptor position during the growth of the semiconductor single-crystal layers. In addition, even if a mechanism the same as that of JP 6068255 is employed to adjust the flow rate of the source gas, the following problem would arise.

That is, it is known that the thickness distribution of a semiconductor single-crystal layer formed on a substrate in a single-wafer vapor phase growth system is greatly affected by the temperature distribution within the main surface of the substrate. Especially, the thickness of the semiconductor single-crystal layer tends to vary toward the larger side at the peripheral edge of the substrate where the temperature easily drops. To prevent this, it is a common practice in a single-wafer vapor phase growth system to provide a preheating ring around a susceptor to ensure even heating of the peripheral edge of the substrate.

However, the system of JP 6068255 fails to include the preheating ring described above, and even when it included the preheating ring, if the height position of the preheating ring is fixed in the reaction vessel, the relative positional relationship between the substrate on the susceptor and the preheating ring in the height direction changes significantly as the height position of the susceptor is changed. As a result, if a height misalignment between the preheating ring and the substrate becomes greater due to the change setting of the susceptor holding position, the preheating ring will not be effective enough to equalize the heat to the outer circumferential portion of the substrate, leading to large thickness variation of the semiconductor single-crystal layer. In addition, since a large step is generated between the main surface of the substrate and the preheating ring, the flow of source gas is easily disturbed as it passes through the step, which can also be a factor causing variations in the thicknesses of the semiconductor single-crystal layers.

It could therefore be helpful to allow adjustment of the flow rate of the source gas by changing the susceptor position in a vapor phase growth system with a preheating ring around the susceptor, and reduce the effect on the thickness variation of the semiconductor single-crystal layer caused by the change of the susceptor position.

SUMMARY

I thus provide a vapor phase growth system that grows a vapor phase of a semiconductor single-crystal thin film on the main surface of a single-crystal substrate, and has a reaction vessel body having a gas inlet port formed on the first end side and a gas outlet port formed on the second end side in the horizontal direction. The system is configured such that the source gas is introduced through the gas inlet port into the main body of the reaction vessel to form a semiconductor single-crystal thin film, the source gas flows along the main surface of the single-crystal substrate, which is substantially horizontally and rotationally held in the inner space of the reaction vessel body, and then is discharged through the gas outlet port. A preheating ring is arranged to surround a susceptor. The system further includes a susceptor position changing mechanism, which changes a height position of holding the susceptor in the reaction vessel body on the basis of raising and lowering of the susceptor to change and set a height dimension of a source gas distribution space formed between the main surface of the single-crystal substrate mounted on the susceptor and a lower surface of an upper wall portion of the reaction vessel body in a stepwise or non-stepwise manner; and a preheating ring position changing mechanism, which changes a height position of holding the preheating ring in the reaction vessel body on the basis of raising and lowering of the preheating ring in accordance with the change in the height position of holding the susceptor.

A method of manufacturing an epitaxial wafer includes the steps of: arranging a single-crystal substrate in a reaction vessel body of a vapor phase growth system including: the reaction vessel body including a gas inlet port on a first end side and a gas outlet port on a second end side in a horizontal direction, where the reaction vessel body is configured such that the single-crystal substrate is substantially horizontally and rotationally held on a disk-shaped susceptor, which is rotationally driven in an inner space of the reaction vessel body, and a source gas for forming a semiconductor single-crystal thin film is introduced into the reaction vessel body through the gas inlet port, flows along the main surface of the single-crystal substrate, and then is discharged through the gas outlet port, and a preheating ring is arranged to surround the susceptor; a susceptor position changing mechanism, which changes a height position of holding the susceptor in the reaction vessel body on the basis of raising and lowering of the susceptor to change and set a height dimension of a source gas distribution space formed between the main surface of the single-crystal substrate mounted on the susceptor and a lower surface of an upper wall portion of the reaction vessel body in a stepwise or non-stepwise manner; and a preheating ring position changing mechanism, which changes a height position of holding the preheating ring in the reaction vessel body on the basis of raising and lowering of the preheating ring in accordance with the change in the height position of holding the susceptor; distributing the source gas in the reaction vessel body; and performing vapor phase epitaxial growth of the semiconductor single crystal thin film on the single-crystal substrate to obtain an epitaxial wafer.

The preheating ring position changing mechanism may be desirably configured to change the height position of holding the preheating ring such that the main surface of the single-crystal substrate on the susceptor is aligned with a top surface of the preheating ring as the height position of holding the susceptor is changed.

Further, the susceptor position changing mechanism may be configured to change the height position of holding the susceptor between a susceptor side first position, in which a height dimension of the source gas distribution space corresponds to a first dimension, and a susceptor side second position, in which a height dimension of the source gas distribution space corresponds to a second dimension which is smaller than the first dimension. The preheating ring position changing mechanism may be configured to change the height position of holding the preheating ring between the first position on the ring side and the second position on the ring side corresponding to the first position on the susceptor side and the second position on the susceptor side, respectively.

The susceptor, for example, is rotationally driven via a rotary shaft member with the upper end coupled to the lower surface of the susceptor. The susceptor position changing mechanism may be configured to raise and lower the susceptor along with the rotary shaft member. The preheating ring position changing mechanism can be configured to include a lift sleeve, which is coaxially positioned outside the rotary shaft member and along an axis of the rotary shaft member while allowing the rotary shaft member to be rotationally driven, a coupling member, which couples the lift sleeve to the preheating ring, and a lifting driving unit, which raises and lowers the lift sleeve and the coupling member in an integrated manner.

Lift pins may be provided each with the lower end protruding downward from the susceptor, to lift up the semiconductor substrate in the form of pushing up the semiconductor substrate on the susceptor from the bottom side. A configuration can be employed in which the base ends of the lift pin driving arms are coupled to the lift sleeve to bias the lift pins upward from below.

Around the susceptor in the reaction vessel body, a lower liner formed in an annular shape with an outer circumferential surface positioned facing the gas inlet port, and an annular upper liner positioned above and opposite the lower liner may be provided. The upper liner guides a flow of the source gas over the main surface of the single-crystal substrate on the susceptor, which is supplied through the gas inlet port, flows against the outer circumferential surface of the lower liner, is dispersed circumferentially, and flows over the lower liner. The lower liner may be configured to include a liner base, which forms the outer circumferential surface and is attached to the reaction vessel body in a fixed vertical position, and a liner movable portion to which the preheating ring is attached on an upper surface thereof, which liner movable portion can slide vertically along with the preheating ring with respect to the liner base. The coupling member above may be configured by the liner movable portion and a coupling auxiliary portion having one end coupled to the lift sleeve and the other end to the liner movable portion.

The preheating ring may be attached to the liner movable portion, for example, such that the top surface of the preheating ring is aligned with the top surface of the liner movable portion. Further, the liner movable portion includes a cylindrical sliding portion with a base end inserted into a groove, which opens on an upper surface of the liner base and is engraved along a circumferential direction of the liner base where the sliding portion slides up and down within the groove. The liner movable portion further includes a flange portion, which extends radially inward from an upper end edge of the sliding portion. The preheating ring is attached to an upper surface of the flange portion.

The vapor phase growth system is configured to change the height position of holding the susceptor in the reaction vessel body by raising and lowering the susceptor by the susceptor position changing mechanism. The position of the susceptor is changed so that the height dimension of the source gas distribution space defined between the main surface of the single-crystal substrate mounted on the susceptor and the lower surface of the upper wall of the reaction vessel body can be changed stepwise or non-stepwise, allowing the adjustment of the flow rate of the source gas when growing a semiconductor single-crystal layer on the single-crystal substrate, in turn allowing the adjustment of the semiconductor single-crystal layer.

A preheating ring position changing mechanism is provided to change the height position of holding the preheating ring in the reaction vessel body on the basis of the raising and lowering of the preheating ring in accordance with the change in the height position of holding the susceptor. This reduces the misalignment between the preheating ring and the substrate in the height direction even if the susceptor holding position is changed, advantageously reducing the effects of insufficient heat equalization effect on the outer circumference of the substrate due to the preheating ring and the effect of turbulence in the source gas flow due to a step between the substrate main surface and the preheating ring, and thereby reducing the effects on the thickness variation of the resulting semiconductor single-crystal layer.

BRIEF DESCRIPTION OF THE DRAWINGS

FIG. 10 is a flowchart illustrating an example of a processing flow of a control program in the control system shown in FIG. 8.

DESCRIPTION OF REFERENCE NUMERALS

1: Vapor Phase Growth System
2: Reaction Vessel Body
3: Lower Portion of Body
4: Upper Portion of Body
4C: Ceiling Plate
5: Inner Space
5A: Source Gas Distribution Space
5B: System Arrangement Space
7: Discharge Pipe
9: Susceptor
9A: Sleeve
9B: Spot Facing
11: Infrared Heating Lamp
12 Preheating Ring Position Changing Mechanism
12A: Lift Pin Driving Arm
12B: Lift Sleeve
12C: Lift Plate
13: Lift Pin
14: Insertion Hole
15: Rotary Shaft Member
15A: Shaft Body
15B: Temperature Sensor
15D: Susceptor Supporting Arm
15C: Coupling Pin
21: Gas Inlet Port
22: Gas Outlet Port
29: Lower Liner
30: Upper Liner
31, 131: Liner Base
32: Preheating Ring
33, 133: Liner Movable Portion
33A: Sliding Portion
33B: Flange Portion
31g: Groove
35: Coupling Auxiliary Portion
39 Susceptor Position Changing Mechanism
40: Motor
41, 42: Air Cylinder
133F: Sliding Spot Facing Portion
EL: Silicon Single-Crystal Thin Film
EW: Silicon Epitaxial Wafer
G: Source Gas
h: First Dimension
h': Second Dimension
O: Rotation Axis
PP: Main Surface
W: Silicon Single-Crystal Substrate

DETAILED DESCRIPTION

The following is a description of an example with reference to the accompanying drawings.

Figures 1, 2:
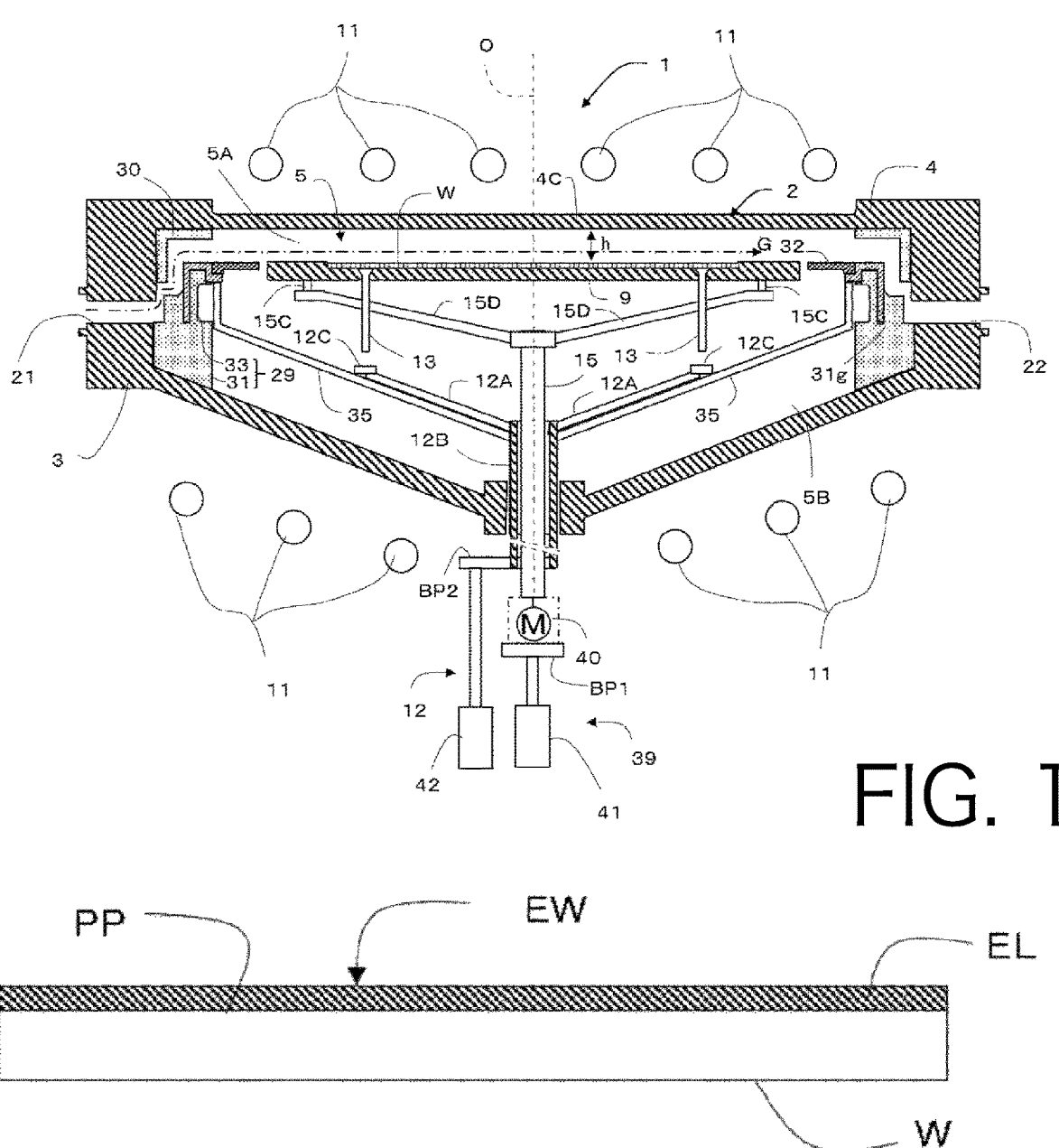
FIG. 1 is a side cross-sectional view illustrating an example of a vapor phase growth system.
FIG. 2 is a schematic diagram illustrating a silicon epitaxial wafer.

FIG. 1 is a schematic side cross-sectional view illustrating an example of a vapor phase growth system 1. As shown in FIG. 2, the vapor phase growth system 1 is used to grow a vapor phase of a silicon single-crystal thin film EL on the main surface (top surface) PP of a silicon single-crystal substrate W to produce a silicon epitaxial wafer EW. As shown in FIG. 1, the vapor phase growth system 1 has a reaction vessel body 2 with a gas inlet port 21 on the first end side and a gas outlet port 22 on the second end side in the horizontal direction. The source gas G for producing a thin film is configured to be introduced into the reaction vessel body 2 through the gas inlet port 21, flow along the main surface of a silicon single-crystal substrate W ("substrate W"), which is substantially horizontally and rotationally held in the inner space 5 of the reaction vessel body 2, and then be discharged through the gas outlet port 22. The entire reaction vessel body 2 is made of quartz and metallic materials such as stainless steel as well as other internal components, and has a structure divided into a lower portion 3 and an upper portion 4 of the body. The inner space 5 includes a source gas distribution space 5A, which is partitioned by the upper portion 4C of the body with the ceiling plate 4C, and a system arrangement space 5B, which is partitioned by the lower portion 3 of the body.

Figure 7:
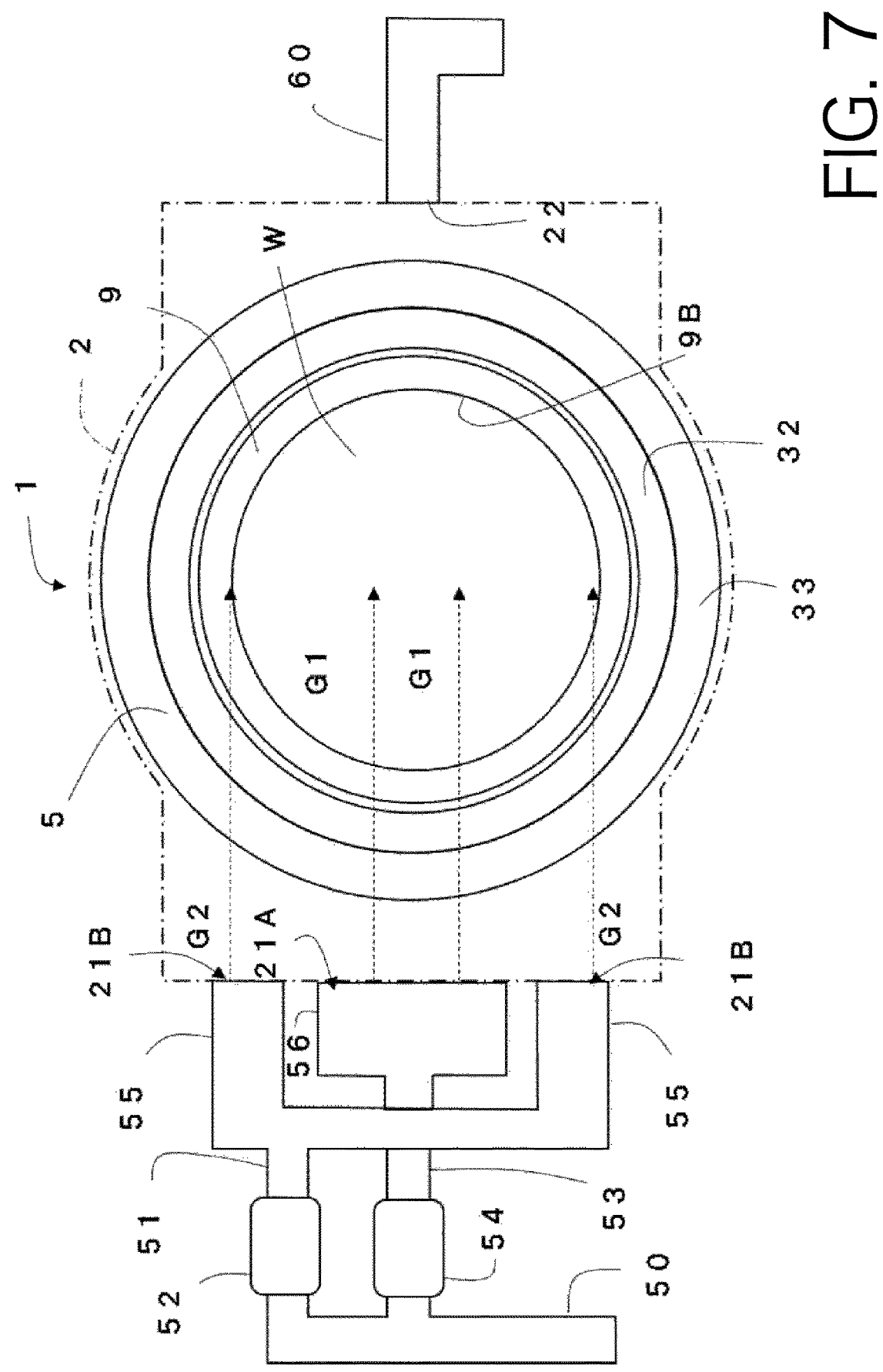
FIG. 7 is a schematic diagram illustrating the vapor phase growth system shown in FIG. 1.

FIG. 7 is a schematic plan view illustrating a configuration of the vapor phase growth system 1. The gas inlet port 21 in FIG. 1 includes a plurality of horizontally arranged gas inlet ports 21A, 21B. The source gas G is introduced into the inner space 5 through the gas inlet ports 21A, 21B by way of the gas piping 50. In this example, the gas piping 50 is branched into inner piping 53 and outer piping 51, and the flow rate of the source gas may be adjusted by corresponding gas flow rate regulators 52, 54. The inner piping 53 opens the inner gas inlet port 21A. The outer piping 51 is further divided into branch pipings 55, 55, which open corresponding outer gas inlet ports 21B, 21B. The source gas G1 through the gas inlet port 21A is supplied to the area forming the central portion of the substrate W, and the source gas G2 through the gas inlet port 21B is supplied to the areas at both the left and right ends of the substrate W, then aggregated at the gas outlet port 22, and discharged into the gas discharge piping 60.

The source gas (G1, G2) is used for growing the vapor phase of the silicon single-crystal thin film on the substrate W above and is selected from silicon compounds such as $SiHCl_3$, $SiCl_4$, $SiH_2Cl_2$, $SiH_4$, and $Si_2H_6$. The source gas G contains $B_2H_6$ or $PH_3$ as dopant gas and $H_2$, $N_2$ and Ar as dilution gas as appropriate. When performing substrate pretreatment (e.g., removal of natural oxide film and adhered organic matter) prior to the thin film vapor phase growth process, a pretreatment gas formed by diluting a corrosive gas appropriately selected from HCl, HF, $ClF_3$, and $NF_3$, for example, with a dilution gas is supplied into the reaction vessel body 2 or a high-temperature heat treatment is performed in the atmosphere of $H_2$.

In FIG. 1, in the inner space 5 of the reaction vessel body 2, a disk-shaped susceptor 9 rotationally driven by a motor 40 about a vertical rotation axis O is arranged, and only one substrate W for producing the silicon epitaxial wafer EW in FIG. 2 is placed within a shallow spot facing 9B (see FIG. 4) formed in the top surface of the susceptor 9. That is, the vapor phase growth system 1 is configured as a horizontal single-wafer vapor phase growth system. The substrate W is, for example, 100 mm or greater in diameter. In addition, as shown in FIG. 1, infrared heating lamps 11 for heating substrates are arranged at predetermined intervals at the top and bottom of the reaction vessel body 2, corresponding to the area where the substrate W is placed. Further, a preheating ring 32 is arranged inside the reaction vessel body 2 to surround the susceptor 9. The source gas distribution space 5A described above is formed between the main surface of the substrate W mounted on the susceptor 9 and the lower surface of the ceiling plate 4C of the reaction vessel body 2.

The susceptor 9 is rotationally driven by the motor 40 via a rotary shaft member 15 with an upper end coupled to the lower surface of the susceptor 9. The base ends of a plurality of susceptor supporting arms 15D are coupled to the tip end position of the rotary shaft member 15. The tip end of each susceptor supporting arm 15D extends in the radial direction of the susceptor 9 while tilting upward, and is coupled to the outer peripheral edge region of the lower surface of the susceptor 9 by a coupling pin 15C.

The vapor phase growth system 1 includes a susceptor position changing mechanism 39 to change and set the height dimension of the source gas distribution space 5A. The susceptor position changing mechanism 39 is used to change the height position of holding the susceptor 9 in the reaction vessel body 2 on the basis of the raising and/or lowering of the susceptor 9. The susceptor position changing mechanism 39 is configured to raise and lower the susceptor 9 along with the rotary shaft member 15 (and the motor 40), and in this example, the lifting driving portion is configured by an air cylinder 41 (or an electric cylinder). The tip end of the cylinder rod of the air cylinder 41 is coupled to the susceptor assembly including the rotary shaft member 15 and the motor 40 via the base material BP1.

Figure 6:
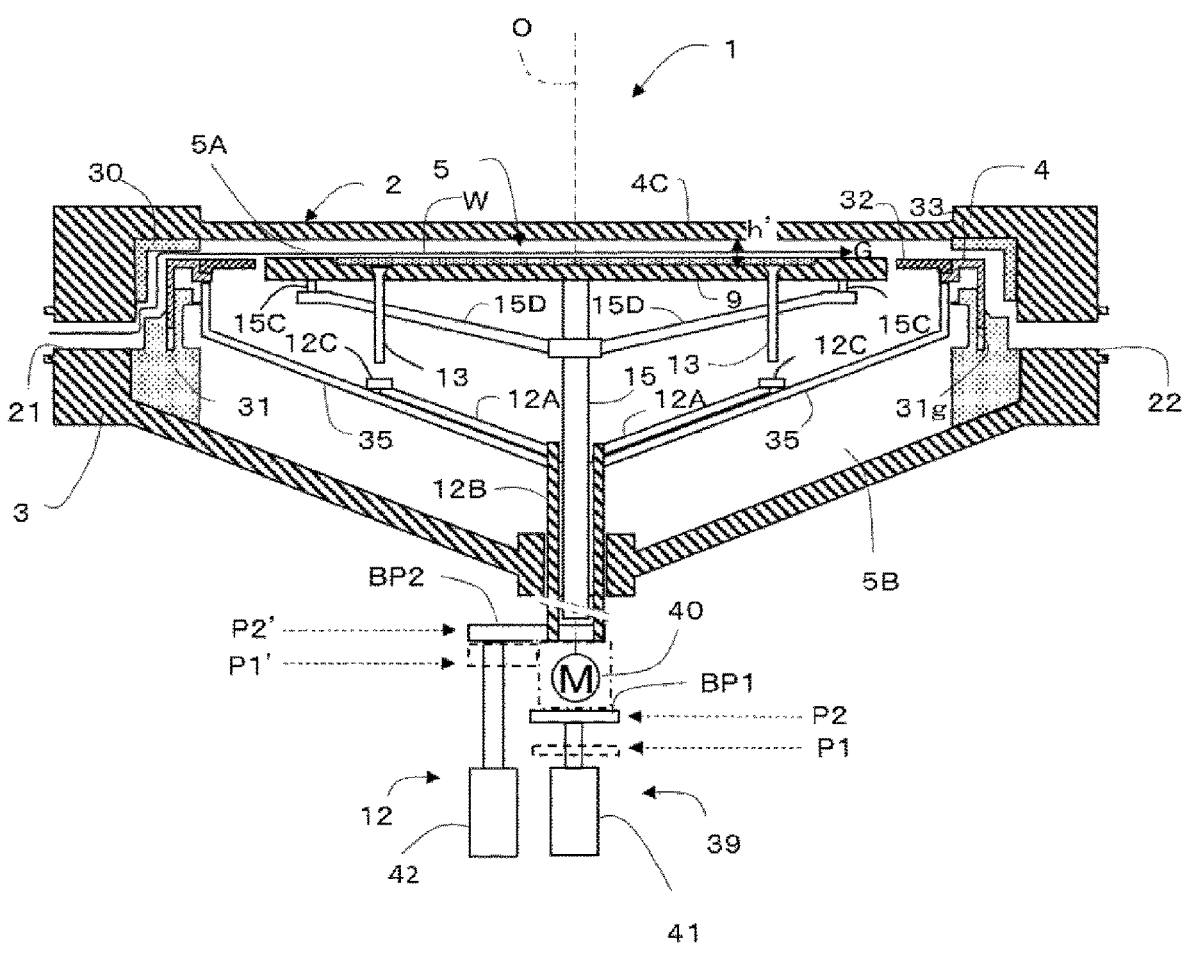
FIG. 6 is a diagram illustrating the operation of the vapor phase growth system shown in FIG. 1.

The height position of holding the susceptor 9 in the silicon single-crystal thin film growth process is selectively set either the first position on the susceptor side (corresponding to the rod retracted position P1 of the air cylinder 41 in FIG. 6; also susceptor side first position P1) where the height dimension d of the source gas distribution space 5A corresponds to the first dimension h shown in FIG. 1 or the second position on the susceptor side (corresponding to the rod advanced position P2 of the air cylinder 41: also susceptor side second position P2) as the second dimension h' (smaller than the first dimension h) shown in FIG. 6. This example has the advantageous effects in that the configuration of the lifting driving unit can be significantly simplified although the values that can be changed for the height dimensions of the source gas distribution space 5A are limited to the first dimension h and the second dimension h'.

Next, the vapor phase growth system 1 shown in FIG. 1 has a preheating ring position changing mechanism 12. The preheating ring position changing mechanism 12 is used to change the height position of holding the preheating ring 32 in the reaction vessel body 2 on the basis of the raising and lowering of the preheating ring 32 in accordance with the change in the height position of holding the susceptor 9. In this example, the preheating ring position changing mechanism 12 includes: a lift sleeve 12B arranged coaxially outside the rotary shaft member 15 and along the axis of the rotary shaft member 15, and capable of being raised and lowered relative to the rotary shaft member 15 while allowing the rotational driving of the rotary shaft member 15, in turn the susceptor 9; a coupling member (liner movable portion 33 and coupling auxiliary portion 35: to be described later), which couples the lift sleeve 12B and the preheating ring 32; and a lifting driving unit (air cylinder 42), which drives the raising and lowering of the lift sleeve 12B and the coupling member in an integrated manner. This example allows the base portion for raising and lowering the preheating ring 32 to be integrated around the rotary shaft member 15 in the form of the lift sleeve 12B, thereby configuring the preheating ring position changing mechanism 12 compact within the limited space (system arrangement space 5B) below the susceptor 9 in the reaction vessel body 2.

As shown in FIG. 1, an annular lower liner 29 is provided around the susceptor 9 in the reaction vessel body 2, with the outer circumferential surface positioned to face the gas inlet port 21. An annular upper liner 30 is provided opposite the lower liner 29 above it. The source gas G supplied through the gas inlet port 21 contacts the outer circumferential surface of the lower liner 29 and tries to flow over the lower liner 29 while dispersing in the circumferential direction. The upper liner 30 serves to direct the flow of this source gas G onto the main surface of the silicon single-crystal substrate W on the susceptor 9.

Figure 5:
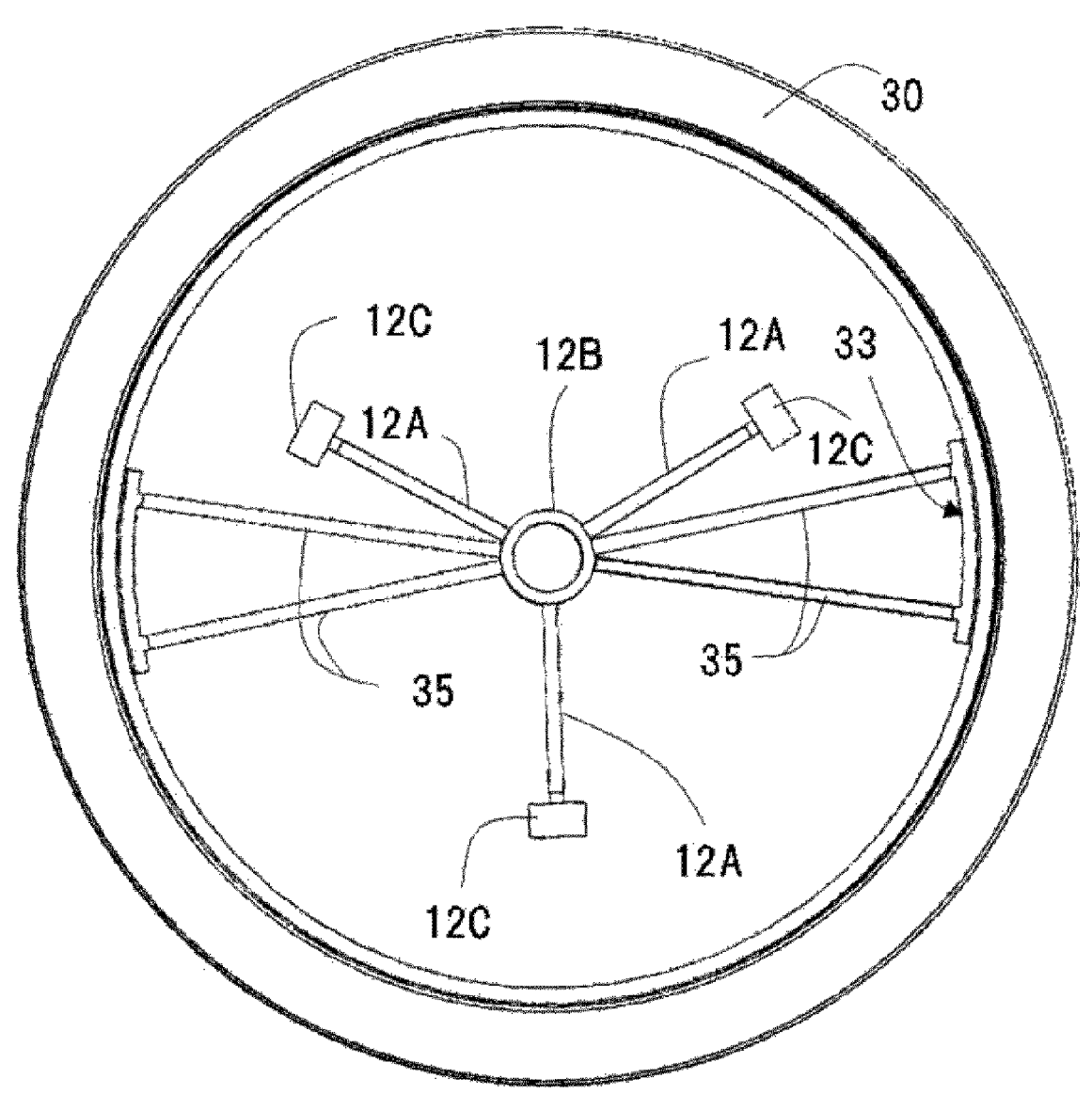
FIG. 5 is a plan view illustrating an example of an arrangement form of an auxiliary coupling portion that raises and lowers the preheating ring.

The lower liner 29 includes a liner base 31 and a liner movable portion 33. The liner base 31 is attached to the reaction vessel body 2 in a fixed vertical position. The liner movable portion 33 includes a preheating ring 32 attached to an upper surface of the liner movable portion 33 and is slidably attached to the liner base 31 in the vertical direction integrally with the preheating ring 32. The liner base 31 forms the outer circumferential surface described above, which receives the flow of the source gas G supplied through the gas inlet port 21. The coupling member described above is configured by the liner movable portions 33 and coupling auxiliary portions 35 each having one end coupled to the lift sleeve 12B and the other end to the corresponding liner movable portion 33. In FIG. 1, each coupling auxiliary portion 35 is formed in the shape of an arm with a base end coupled to the lift sleeve 12B and a tip end coupled to the corresponding liner movable portion 33. A plurality of the coupling auxiliary portions 35 is provided (four in the configuration shown in FIG. 5) around the central axis of the lift sleeve 12B, for example, as shown in FIG. 5. In FIG. 5, the susceptor 9 and preheating ring 32 are omitted.

Figure 3:
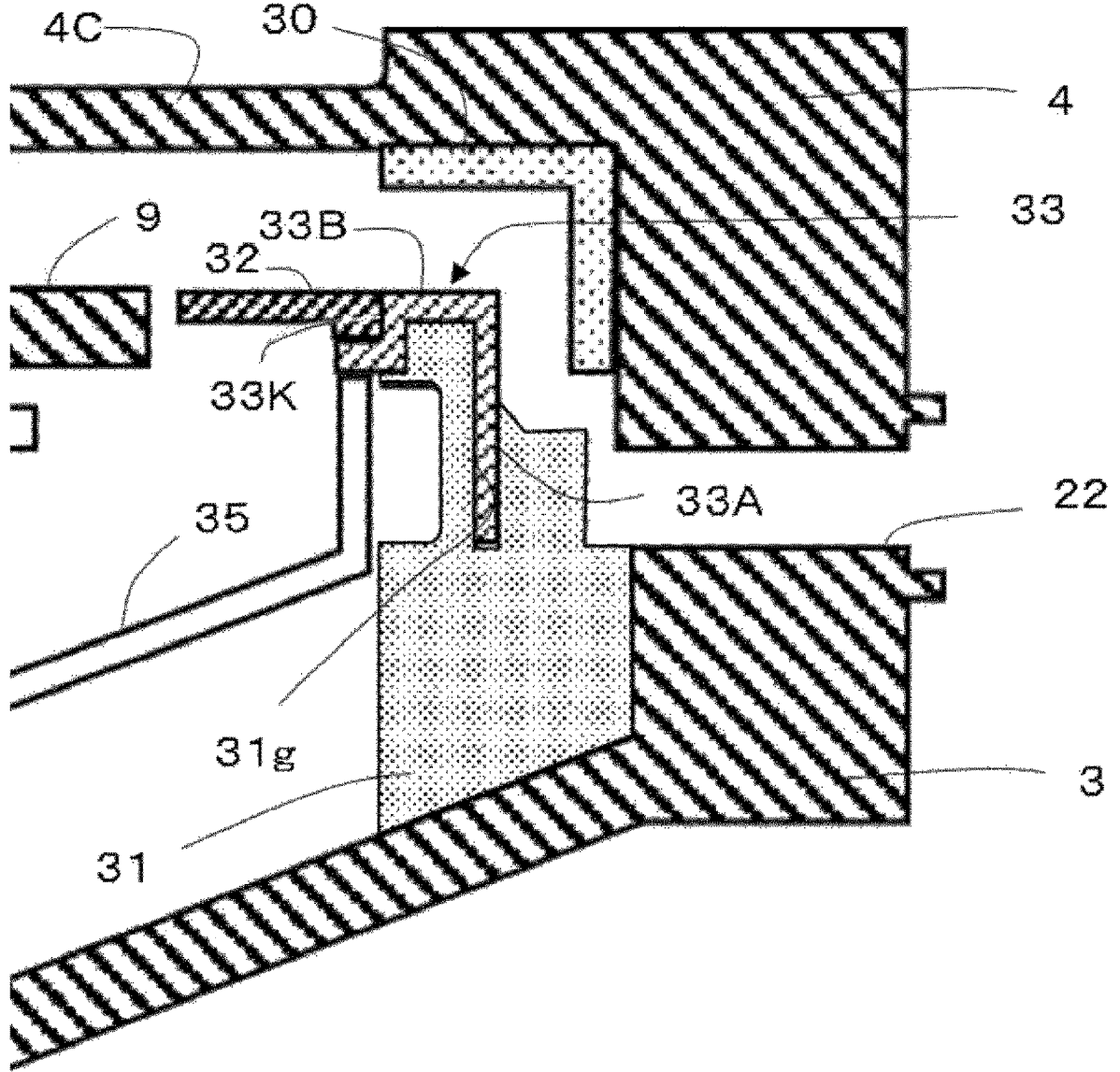
FIG. 3 is a side cross-sectional view illustrating an example of a lifting and sliding portion of a preheating ring in the vapor phase growth system shown in FIG. 1.

As shown enlarged in FIG. 3, the liner movable portion 33 has a cylindrical sliding portion 33A and a flange portion 33B extending radially inward from the upper end edge of the sliding portion 33A. On the other hand, the liner base 31 has a groove portion 31g engraved into the liner base 31, which is open on the top surface of the liner base 31 and along the circumferential direction. The lower end of the sliding portion 33A of the liner movable portion 33 is inserted into the groove portion 31g and slides up and down in the groove portion 31g. The preheating ring 32 is attached to the top surface of the flange portion 33B. In the above configuration, the sliding portion 33A of the liner movable portion 33 to which the preheating ring 32 is directly attached slides in the height direction inside the groove portion 31g of the liner base 31 while fitting into the groove portion 31g of the liner base 31, facilitating horizontally maintaining the preheating ring 32 when the height position of holding the preheating ring 32 is changed.

As shown in FIG. 1, the preheating ring position changing mechanism 12 includes an air cylinder 42 as the lifting driving unit in this example. The tip end of the cylinder rod of the air cylinder 42 is coupled to the liner movable portion 33 via the base material BP2. The preheating ring position changing mechanism 12 changes the height position of the preheating ring 32 between the first position on the ring side (see FIG. 6: rod retracted position P1' of the air cylinder 42: also ring side first position P1') corresponding to the susceptor side first position (FIG. 6, refer to reference numeral P1) shown in FIG. 1 and the second position on the ring side (see FIG. 6: corresponding to the rod advanced position P2': also ring side second position P2') corresponding to the susceptor side second position shown in FIG. 6 (FIG. 6: see reference numeral P2). This also greatly simplifies the configuration of the lifting driving unit of the preheating ring position changing mechanism 12.

In this example, the preheating ring position changing mechanism 12 is configured to change the height position of holding the preheating ring 32 such that the main surface of the silicon single-crystal substrate W on the susceptor 9 is aligned with the top surface of the preheating ring 32 as the height position of holding the susceptor 9 is changed, as shown in FIGS. 1 and 3. Even if the height position of holding the preheating ring 32 is changed, the top surface of the preheating ring 32 is aligned with the main surface of the silicon single-crystal substrate W on the susceptor 9, generating no step between the main surface of the substrate and the preheating ring 32 and effectively suppressing turbulence in the source gas flow when passing through them.

As shown in FIG. 3, the preheating ring 32 is attached to the liner movable portion 33 such that the top surface of the preheating ring 32 is aligned with the top surface of the liner movable portion 33. This eliminates the step between the top surface of the preheating ring 32 and the top surface of the liner movable portion 33 (lower liner), more effectively suppressing turbulence in the source gas flow. In this example, the preheating ring 32 is attached to the liner movable portion 33 in the form of being fitted into the spot facing 33K formed along the inner circumferential edge of the top surface of the flange portion 33B.

Figure 4:
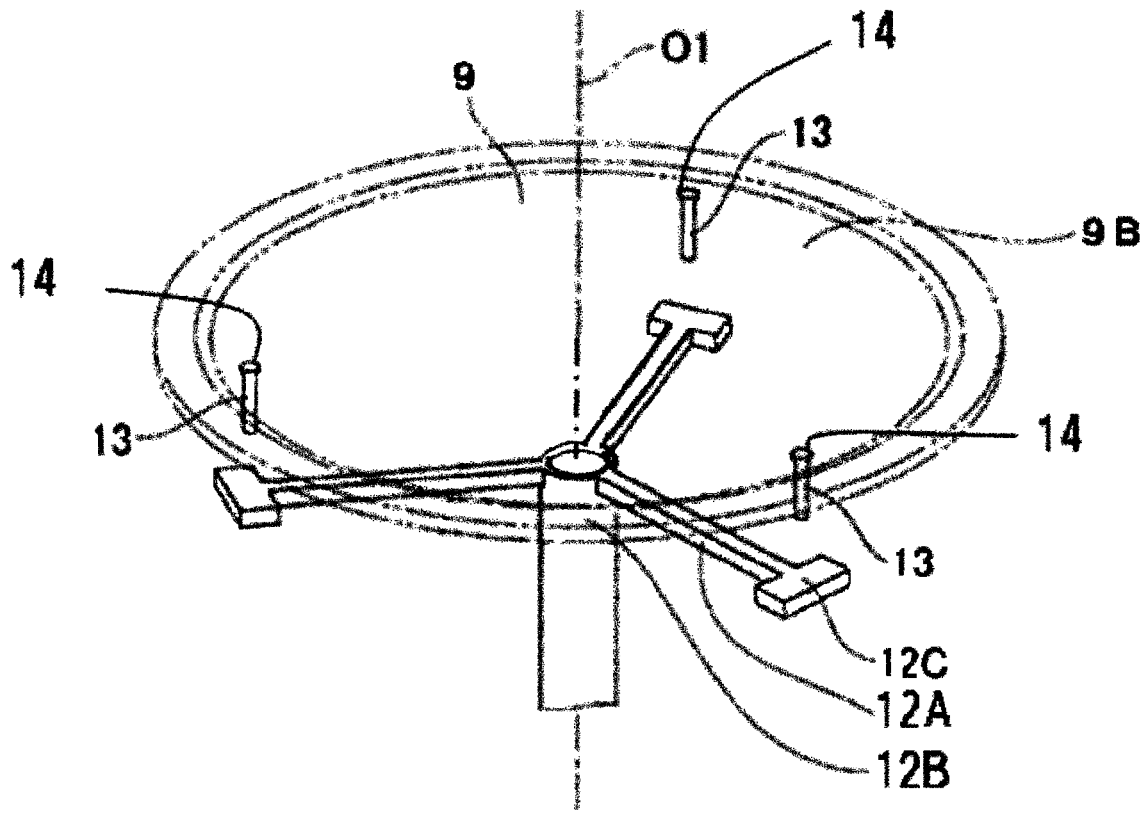
FIG. 4 is a perspective view illustrating a lift pin driving mechanism taken out of the vapor phase growth system illustrated in FIG. 1.

Next, as shown in FIG. 1, the susceptor 9 includes lift pins 13, which lift up the substrate W on the susceptor 9 from below and include lower ends protruding downward from the susceptor 9. FIG. 4 is a perspective view illustrating the taken out lift pin driving mechanism (drawn such that portions related to the raising and lowering of the preheating ring 32 such as the coupling auxiliary portions 35 are omitted). In the peripheral edge of the bottom portion of the spot facing 9B of the susceptor 9, a plurality of lift pin insertion holes 14 are formed from the top to the bottom therethrough in the circumferential direction. The spot facing is configured such that the upper end of each lift pin 13 has a greater diameter head than that of the base end, and the upper end of each insertion hole 14 corresponds to a diameter expanded to be in accordance with the head of the lift pin 13. The lower surface of the head of the lift pin 13 contacts the bottom surface of the insertion hole 14 in the spot facing, preventing the lift pin from falling out of the susceptor 9.

The base end of each of a plurality of the lift pin driving arms 12A for biasing the corresponding lift pin 13 upward from below is coupled to the lift sleeve 12B above. This example allows the lift sleeve 12B to be shared by the preheating ring position changing mechanism 12 and the biasing mechanisms of the lift pins 13, reducing the number of parts.

Each lift pin driving arm 12A extends in the radial direction of the susceptor 9 with the tip end inclined upward (in the example shown in FIG. 4, three lift pin driving arms 12A are arranged at equal angular intervals around the central axis of the susceptor 9). The tip end of each lift pin driving arm 12A is wider than the base portion thereof, and a lift plate 12C is formed to face the lower end surface of the corresponding lift pin 13 and the lower side.

When the lift sleeve 12B approaches relative to the lower surface of the susceptor 9 along the rotary shaft member 15, the lift pins 13 are biased upward by the lift plates 12C of the lift pin driving arms 12A. The substrate W on the susceptor 9 is then pushed up from the bottom side by the lift pins 13 to be lifted up, allowing the substrate W to be easily collected after the silicon single-crystal thin film is formed. With the height position of the lift sleeve 12B fixed, the susceptor 9 may be lowered and the lift pins 13 may be biased by integrally retreating the susceptor 9 and rotary shaft member 15 (and the motor 40 and air cylinder 41) by another air cylinder (not shown).

The operations of the vapor phase growth system 1 above will be described below.

As shown in FIG. 1, after setting the substrate W on the susceptor 9 and performing pretreatment such as natural oxide film removal as needed, the air cylinder 41 of the susceptor position changing mechanism 39 is driven to set the height position of the susceptor 9 (and the substrate W supported by the susceptor 9) to either the first susceptor side position P1 shown in FIG. 1 or the susceptor side second position P2 shown in FIG. 6. Accordingly, the height dimension of the source gas distribution space 5A may be the first dimension h where the flow rate of the source gas is small at the setting of the first position P1 (FIG. 1) on the susceptor side, and the second dimension h' (<h) where the flow rate of the source gas is great at the setting of the second position P2 (FIG. 6) on the susceptor side.

Further, the air cylinder 42 of the preheating ring position changing mechanism 12 is driven to set the height position of the preheating ring 32 to the corresponding first position P1' on the ring side when the first position P1 on the susceptor side (FIG. 1) is set, and to the corresponding second position P2' on the ring side when the second position P2 on the susceptor side (FIG. 6) is set. In both examples, the top surface position of the preheating ring 32 is aligned such that it is almost flush with the main surface (top surface) of the substrate W on the susceptor 9.

In this state, the substrate W is heated to a predetermined reaction temperature by the infrared heating lamps 11 in the state where the substrate W is rotated, and the source gas G is introduced into the reaction vessel body 2 through the gas inlet port 21. The source gas G flows toward the outer circumferential surface of the liner base 31 of the lower liner 29. The gas flow contacting the outer circumferential surface of the liner base 31 rides over the top surface of the liner movable portion 33, passes through the top surface of the preheating ring 32, flows along the main surface of the substrate W, and is discharged through the gas outlet port 22. In this process, as shown in FIG. 2, a silicon single-crystal thin film EL is epitaxially grown on the main surface PP of the substrate W.

In a single-wafer vapor phase growth system such as the vapor phase growth system 1, the setting position shown in FIG. 1 is convenient when the growth rate of semiconductor single-crystal layers should be maintained low, for example, when the requirement for flatness of the main surface of the epitaxial wafer where elements are fabricated is particularly strict. In contrast, the setting positions of the susceptor 9 and preheating ring 32 shown in FIG. 6 are convenient for increasing the growth rate of semiconductor single-crystal layers and improving production efficiency. In addition, since the susceptor 9 approaches the infrared heating lamps 11 closer in the setting position, the rate of temperature increase is increased when the substrate W is heated to the target temperature, thereby shortening the heating sequence. The increase in the gas filling rate of the source gas distribution space 5A also contributes to the improvement in the rate of the temperature increase of the substrate W.

As already described above, the top surface of the preheating ring 32 is aligned with the main surface (top surface) of the substrate W on the susceptor 9 under all conditions, advantageously reducing the effects of insufficient heat equalization effect on the outer circumferential portion of the substrate W due to the preheating ring 32 and turbulence in the source gas flow caused by the step between the main surface of the substrate W and the preheating ring 32, thereby reducing the effects on the thickness variation of the obtained silicon single-crystal layers.

The vapor phase growth system 1 is configured as a cold-wall type vapor phase growth system. When employing such a cold-wall type vapor phase growth system, Japanese Laid-Open Patent Publication No. 2011-165948 suggests that increasing the flow rate of the source gas may suppress the accumulation of silicon deposits as reaction products on the inner wall of the quartz glass forming the reaction vessel body 2 during the epitaxial growth. On the basis of this example, the accumulation of the silicon deposits on the inner surface of the reaction vessel body 2 may also be advantageously restricted by reducing the height dimension of the source gas distribution space 5A and increasing the flow rate of the source gas as shown in FIG. 6, for example. The above advantageous effect is expected to be particularly noticeable when conditions that tend to cause the accumulation of the silicon deposits are employed such as when $SiH_2Cl_2$ (dichlorosilane S) is used as the silicon source gas and epitaxial growth is performed at high temperatures (e.g. 1,150° C.) and reduced pressure (e.g. 60 Torr).

Figures 8, 9:
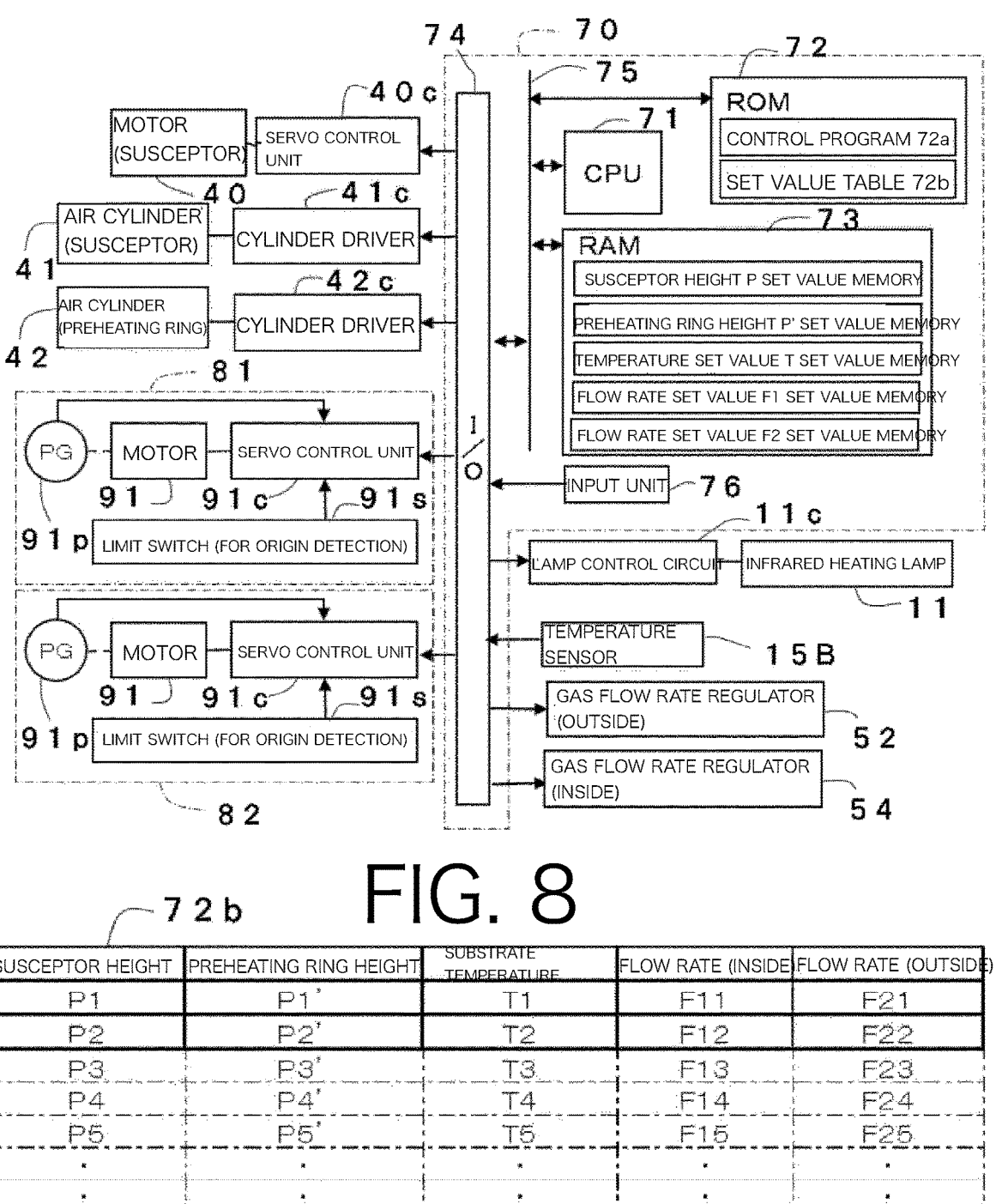
FIG. 8 is a block diagram illustrating a control system of the vapor phase growth system shown in FIG. 1.
FIG. 9 is a schematic diagram illustrating a set value table.

An example of the control configuration of the vapor phase growth system 1 will be described below. FIG. 8 is a block diagram illustrating the electrical configuration of the control system of the vapor phase growth system 1. The control system is configured in the form of a control computer 70 as the control entity. The control computer 70 is configured by a CPU 71, a ROM 72 (program storage unit) that stores a control program 72a, a RAM 73 that serves as work memory when the CPU 71 executes the control program 72a, and an input/output unit 74 that electrically inputs and outputs control information, all interconnected by an internal bus 75 (data bus+address bus).

The driving elements of the vapor phase growth system 1 shown in FIG. 1 are connected to the control computer 70 as described below. The infrared heating lamp 11 is connected to the I/O unit 74 via a lamp control circuit 11c. The temperature sensor 15B for detecting the substrate temperature is connected to the I/O unit 74. The gas flow rate regulators 52 and 54 both have flow detection units and built-in valves (not shown), and are connected to the I/O unit 74 to receive instructions from the control computer 70 and control the source gas on each pipe continuously variable by the built-in valves above.

The motor 40, which drives the susceptor 9, is connected to the I/O unit 74 via a servo control unit 40c. The servo control unit 40c monitors the rotation speed of the motor 40 on the basis of pulses entered from the pulse generator 40p (rotation sensor) attached to the output shaft of the motor 40, and controls the driving such that the rotation speed of the motor 40 (and, in turn, the susceptor 9) is maintained constant by referring to the rotation speed indication values from the control computer 70. Further, the air cylinder 41, which raises and lowers the susceptor 9, is connected to the input/output unit 74 via a cylinder driver 41c, and the air cylinder 42, which raises and lowers the preheating ring 32, is connected to the input/output unit 74 via a cylinder driver 42c (In the configuration in which the air cylinders 41 and 42 are incorporated, the screw shaft driving units 81 and 82 described below are not needed).

In this example, the output of the infrared heating lamps 11 (i.e., the temperature of the substrate W during deposition), the flow rate of the outer source gas G2 controlled by the gas flow rate regulator 52, and the flow rate of the inner source gas G1 controlled by the gas flow rate regulator 54 are appropriately set in accordance with the set values of the height position P of the susceptor and the height position P' of the preheating ring (i.e., the height dimension of the source gas distribution space 5A) to be set.

If the height of the source gas distribution space 5A changes in FIG. 1, the gas distribution resistance on the main surface of the substrate W may change in the radial distribution. In FIG. 7, if the flow rate of the inner source gas G1 and the flow rate of the outer source gas G2 are maintained constant, the flow rate and temperature distribution of the source gas distributed to the outer circumferential region of the main surface of the substrate W and the flow rate distribution (or temperature distribution) of the source gas distributed to the inner circumferential region may change, and the thickness distribution of the inner and outer circumferences of the formed silicon single-crystal film may change in accordance with the values of the height of the source gas distribution space 5A set. As described above, changing the flow rate of the inner source gas G1 and the flow rate of the outer source gas G2 (and also the temperature of the substrate W during deposition) in accordance with the set values of the height of the source gas distribution space 5A may be advantageous in eliminating these problems.

In this example, as shown in FIG. 8, a set value table 72b is stored in the ROM 72 of the control computer 70, which table is referred to by the control program 72a. As shown in FIG. 9, this set value table 72b contains the values of the height position of holding the preheating ring (ring side first position P1' and ring side second position P2'), temperature T1, T2, flow rates F11, F12 (inside) and F21, F22 (outside), each corresponding to the multiple (here two) height holding positions (susceptor side first position P1 and susceptor side second position P2), which can be set for the susceptor 9. The values are read out in accordance with the values of the susceptor height to be set, and the read out values are stored in the corresponding memory in the RAM 73 for use in control. However, if the concern about the occurrence of such problems is small, some or all of the flow rate of the inner source gas G1, the flow rate of the outer source gas G2, and the temperature of the substrate W during deposition may be set to certain appropriate values independent of the values of the height of the source gas distribution space 5A.

With reference to FIG. 10, an example of the flow of operation of the vapor phase growth system 1 according to the control program 72a will be described. In step S101, the height position P of the susceptor is set, and in step S102, the height position P' of the corresponding preheating ring is set. In step S103, the susceptor 9 and preheating ring 32 are moved to the work receiving position. The work receiving position may be set, for example, as the susceptor height (susceptor side first position P1: see FIG. 6) shown in FIG. 1 when the height of the source gas distribution space 5A is greater. In step S104, the work (substrate W) is transferred from the preparation chamber (not shown) of the vapor phase growth system 1 and set on the susceptor 9. In step S105, the infrared heating lamps 11 are activated to increase the temperature in the inner space 5 to a set temperature. In step S106, the air cylinders 41 and 42 are activated to move the susceptor and preheating ring to the set height holding position. The process then proceeds to step S107 where the susceptor 9 is started to be driven to rotate, and in step S108, the distribution of the source gas is started at the set flow rate. This deposits a silicon single-crystal layer on the substrate W as a work. This process continues until the deposition is completed by the elapse of a predetermined time. When the deposition is completed, the process proceeds to step S109, where the susceptor 9 and preheating ring 32 are moved to the work take-out position, and in step S110, the work after the deposition (i.e., silicon epitaxial wafer EW in FIG. 2) is taken out.

The examples are described above, but they are not limited to those described above. For example, above, a single-wafer system for manufacturing silicon epitaxial wafers by chemical vapor deposition (CVD) is illustrated as the vapor phase growth system 1, but the manufacturing object is not limited to the silicon epitaxial wafers. It may also be applied to a system for epitaxial growth of a compound semiconductor single-crystal layer on a single-crystal substrate such as sapphire and silicon by metal-oxide vapor phase epitaxy (MOVPE).

Figure 11:
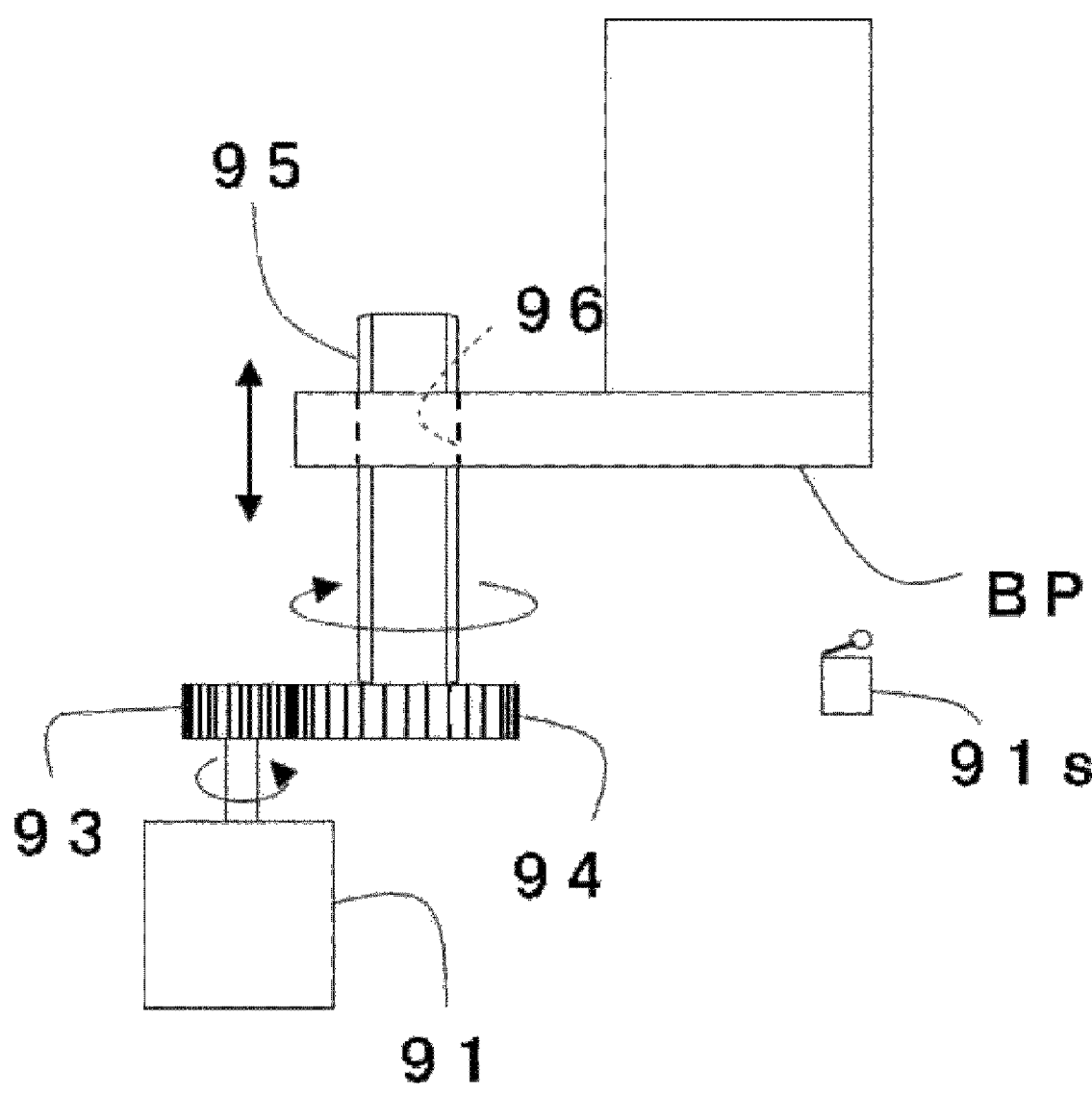
FIG. 11 is a schematic diagram illustrating an example of a screw shaft mechanism.

The height position of holding the susceptor 9 (and thus the height dimension of the source gas distribution space 5A) in the silicon single-crystal thin film growth process may be selected to be set to one of three or more predetermined values, or it may be set to a stepless and optional holding position within a predetermined numerical range. In this example, the lifting driving units of the susceptor position changing mechanism 39 and the preheating ring position changing mechanism 12 may be configured by a well-known servomotor-driven screw shaft mechanism in place of the air cylinders 41 and 42. FIG. 11 illustrates an example of a screw shaft mechanism, in which the rotational output of a motor 91 is transmitted to a screw shaft 95 via gears 93 and 94. The screw shaft 95 is screwed into a nut portion 96, which passes through the base material BP (collectively, the base materials BP1 and BP2 in FIG. 1), and is driven to be rotated by the motor 91 to raise and lower the base material BP, which supports the susceptor 9 or preheating ring 32, allowing any height position to be held. A limit switch (origin detection unit) 91s detects the origin position of the substrate BP in the height direction.

In this example, the control system in FIG. 8 replaces the pairs of air cylinders 41, 42 and cylinder drivers 41c, 42c with the corresponding screw shaft driving units 81 (for lifting susceptor) and 82 (for lifting preheating ring) shown in a long dashed short dashed line. Their electrical structures are substantially the same, and will be represented by one of them and described. That is, the motor 91 driving the screw shaft 95 (FIG. 11) is connected to the input/output unit 74 via the servo control unit 91c. The servo control unit 91C drives the motor 91 in the downward direction upon initialization. When the base material BP biases the limit switch 91s, the motor 91 stops rotating and resets the counter for counting the pulse inputs from the pulse generator 91p (angle sensor) attached to the output shaft of the motor 91. Next, the target pulse number is set in accordance with the set values of the susceptor height and preheating ring height from the control computer 70, and motor 91 is driven in the upward direction. If the number of pulses counted by the counter reaches the target number of pulses, the rotation of motor 91 is stopped. In this example, the set value table 72b in FIG. 9 is configured as containing the values P1', P2', P3' . . . of the height position of the preheating ring, temperature T1, T2, T3 . . . , and flow rates F11, F12, F13 . . . and F21, F22, F23 . . . corresponding to three or more values P1, P2, P3 . . . of the height position of the susceptor.

Figure 12:
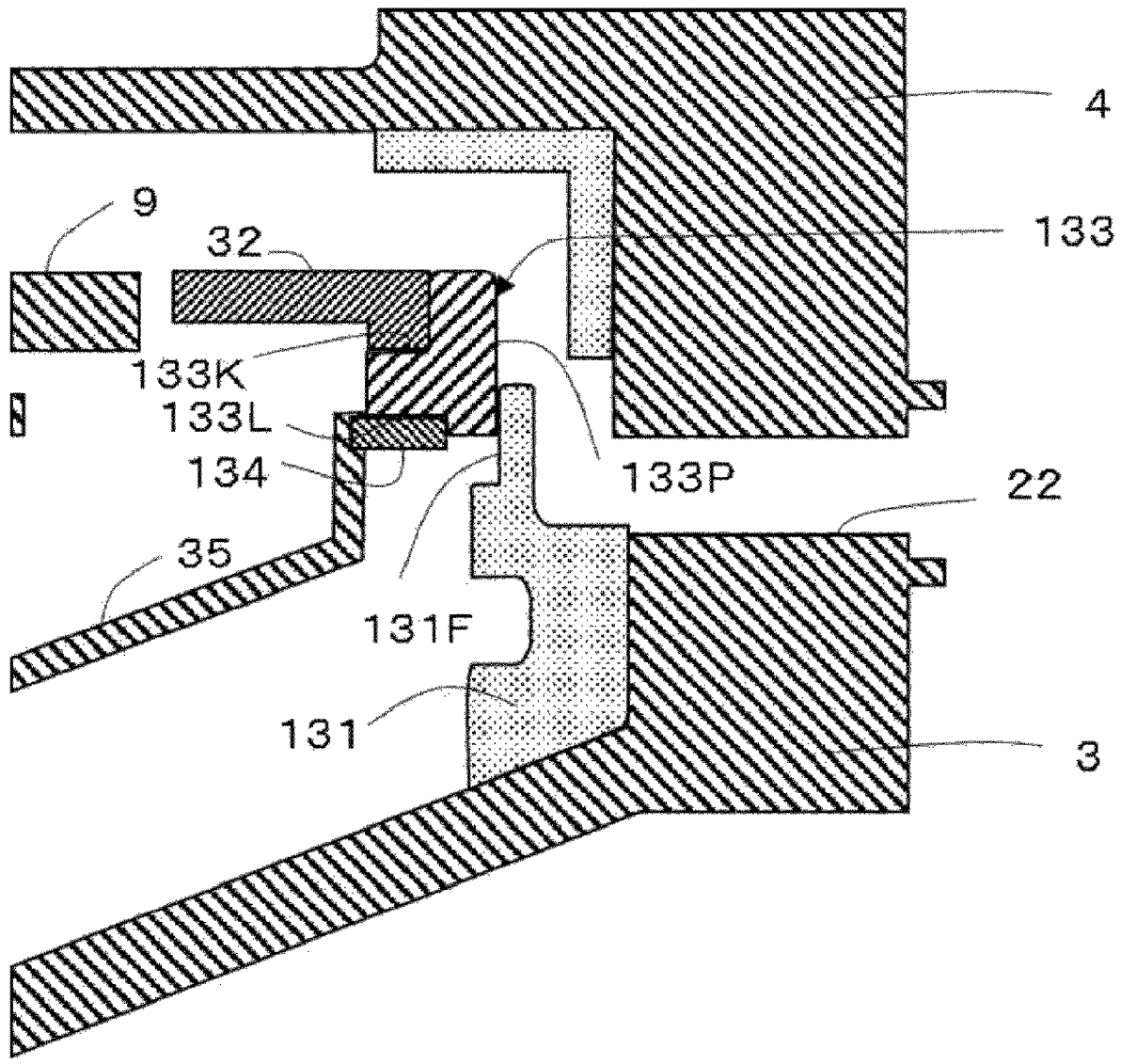
FIG. 12 is a side cross-sectional view illustrating a variation of the lifting sliding portion of the preheating ring.

The examples are described above, but they are not limited to those described above. With reference to FIG. 12, a variation of the lifting and sliding portion of the preheating ring 32 illustrated in FIG. 3 will be described (components that are common to FIG. 3 are given the same reference numerals, and detailed description thereof will be omitted). In FIG. 12, a liner base 131 substitutes for the liner base 31 in FIG. 3. The liner base 131 is formed in the shape of a ring and includes a sliding spot facing 131F along the upper inner circumferential edge. Further, a liner movable portion 133 substitutes for the liner movable portion 33 in FIG. 3. The lower end of the liner movable portion 133 is inserted into the sliding spot facing 131F of the liner base 131 and slides up and down with its outer circumferential surface guided along the inner circumferential surface of the sliding spot facing 131F. The inner circumferential surface of the sliding spot facing 131F and the outer circumferential surface of the liner movable portion 133 correspond to both cylindrical surfaces.

The preheating ring 32 is fitted into the first spot facing 133K such that the top surface of the preheating ring 32 is aligned with the top surface of the liner movable portion 133. The tip end of the coupling auxiliary portion 35 is coupled to the coupling frame 134, which is fitted into the second spot facing 133L of the liner movable portion 133.

According to the above example, the outer circumferential surface of the liner movable portion 133 to which the preheating ring 32 is directly attached slides inside the liner base 131 in the height direction while being guided by the inner circumferential surface of the liner base 131, achieving an advantageous effect that the preheating ring 32 can be horizontally maintained when the height position of holding the preheating ring 32 is changed in the same manner as when the configuration shown in FIG. 3 is employed. In addition, the sliding surface of the liner base 131 side with respect to the liner movable portion 133 is changed from the two inner circumferential surfaces of the groove 31g in FIG. 3 to a single inner circumferential surface of the sliding spot facing 131F, significantly simplifying the cross-sectional shapes of both the liner movable portion 133 and liner base 131 in comparison to the configuration in FIG. 3, and thus facilitating the machining.

INCORPORATION BY REFERENCE

This application is a continuation application of International Application No. PCT/JP2021/024794, filed on Jun. 30, 2021, which claims priority of Japanese (JP) Patent Application No. 2020-172195, filed on Oct. 12, 2020, the contents of which are hereby incorporated by reference in its entirety.

What is claimed is:

1. A vapor phase growth system that grows a semiconductor single-crystal thin film on a main surface of a single-crystal substrate, the vapor phase growth system comprising:

a reaction vessel body including a gas inlet port on a first end side and a gas outlet port on a second end side in a horizontal direction, wherein the reaction vessel body is configured such that the single-crystal substrate is substantially horizontally and rotationally held on a disk-shaped susceptor, which is rotationally driven in an inner space of the reaction vessel body, and a source gas that forms a semiconductor single-crystal thin film is introduced into the reaction vessel body through the gas inlet port, flows along the main surface of the single-crystal substrate, and is discharged through the gas outlet port, and a preheating ring is arranged to surround the susceptor;

a susceptor position changing mechanism that changes a height position of holding the susceptor in the reaction vessel body based on raising and lowering of the susceptor to change and set a height dimension of a source gas distribution space formed between the main surface of the single-crystal substrate mounted on the susceptor and a lower surface of a ceiling plate of the reaction vessel body in a stepwise or non-stepwise manner; and a preheating ring position changing mechanism that changes a height position of holding the preheating ring in the reaction vessel body based on raising and lowering of the preheating ring in accordance with the change in the height position of holding the susceptor;

the preheating ring position changing mechanism includes a lift sleeve coaxially positioned outside the rotary shaft member and along an axis of the rotary shaft member while allowing the rotary shaft member to be rotationally driven, a coupling member that couples the lift sleeve to the preheating ring, and a lifting driving unit that raises and lowers the lift sleeve and the coupling member in an integrated manner.

2. The vapor phase growth system according to claim 1, wherein the preheating ring position changing mechanism changes the height position of holding the preheating ring such that the main surface of the single-crystal substrate on the susceptor is aligned with a top surface of the preheating ring as the height position of holding the susceptor is changed.

3. The vapor phase growth system according to claim 1, wherein the susceptor position changing mechanism changes the height position of holding the susceptor between a susceptor side first position, in which a height dimension of the source gas distribution space corresponds to a first dimension, and a susceptor side second position, in which a height dimension of the source gas distribution space corresponds to a second dimension which is smaller than the first dimension, and the preheating ring position changing mechanism changes the height position of holding the preheating ring between a ring side first position and a ring side second position corresponding to the susceptor side first position and the susceptor side second position, respectively.

4. The vapor phase growth system according to claim 1, wherein the susceptor is rotationally driven via a rotary shaft member with an upper end coupled to a lower surface of the susceptor, and the susceptor position changing mechanism raises and lowers the susceptor along with the rotary shaft member.

5. The vapor phase growth system as claimed in claim 4, wherein a lift pin with a lower end protruding downward from the susceptor is provided to lift up the single-crystal substrate on the susceptor in the form of pushing up the single-crystal substrate from a bottom side, and a base end of a lift pin driving arm for biasing the lift pin upward from below is coupled to the lift sleeve.

6. The vapor phase growth system according to claim 4, further comprising:

around the susceptor in the reaction vessel body, an annular lower liner with an outer circumferential surface positioned facing the gas inlet port, and an annular upper liner positioned above and opposite the lower liner, wherein the upper liner guides a flow of the source gas over the main surface of the single-crystal substrate on the susceptor, which is supplied through the gas inlet port, flows against the outer circumferential surface of the lower liner, is dispersed circumferentially, and flows over the lower liner, the lower liner includes a liner base that forms the outer circumferential surface and is attached to the reaction vessel body in a fixed vertical position, and a liner movable portion to which the preheating ring is attached on an upper surface thereof, which liner movable portion can slide vertically along with the preheating ring with respect to the liner base, and the coupling member is configured by the liner movable portion and a coupling auxiliary portion with one end coupled to the lift sleeve and another end coupled to the liner movable portion.

7. The vapor phase growth system according to claim 6, wherein the preheating ring is attached to the liner movable portion such that a top surface of the preheating ring is aligned with a top surface of the liner movable portion, and the preheating ring position changing mechanism changes the height position of holding the preheating ring such that the main surface of the single-crystal substrate on the susceptor is aligned with a top surface of the preheating ring as the height position of holding the susceptor is changed.

8. The vapor phase growth system according to claim 7, wherein the liner movable portion includes a cylindrical sliding portion with a base end inserted into a groove that opens on an upper surface of the liner base and is engraved along a circumferential direction of the liner base, the sliding portion sliding up and down within the groove, and a flange portion that extends radially inward from an upper end edge of the sliding portion, and the preheating ring is attached to an upper surface of the flange portion.

9. The vapor phase growth system according to claim 7, wherein the liner base is formed in a shape of a ring and includes a sliding spot facing along an upper inner circumferential edge, and the liner movable portion is formed in a shape of a ring and configured such that a base end of the liner movable portion is inserted into the sliding spot facing of the liner base, and the liner movable portion slides up and down with an outer circumferential surface guided along an inner circumferential surface of the sliding spot facing.

* * * * *